United States Patent
Landru et al.

(10) Patent No.: US 9,875,914 B2
(45) Date of Patent: Jan. 23, 2018

(54) PROCESS FOR MANUFACTURING A PLURALITY OF STRUCTURES

(71) Applicant: Soitec, Crolles (FR)

(72) Inventors: Didier Landru, Champ Pres Froges (FR); Oleg Kononchuk, Grenoble (FR); Christophe Gourdel, Saint Maximin (FR); Carole David, Crolles (FR); Sebastien Mougel, Saint Martin d'Heres (FR); Xavier Schneider, Le Versoud (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/898,937

(22) PCT Filed: Jun. 11, 2014

(86) PCT No.: PCT/FR2014/051406
§ 371 (c)(1),
(2) Date: Dec. 16, 2015

(87) PCT Pub. No.: WO2014/202866
PCT Pub. Date: Dec. 24, 2014

(65) Prior Publication Data
US 2016/0372342 A1 Dec. 22, 2016

(30) Foreign Application Priority Data

Jun. 18, 2013 (FR) .................................... 13 01437

(51) Int. Cl.
*H01L 21/00* (2006.01)
*H01L 21/67* (2006.01)
(Continued)

(52) U.S. Cl.
CPC .. *H01L 21/67017* (2013.01); *H01L 21/02238* (2013.01); *H01L 21/02255* (2013.01);
(Continued)

(58) Field of Classification Search
CPC . H01L 21/477; H01L 21/46; H01L 21/67017; H01L 21/7624; H01L 21/67309; H01L 21/02238; H01L 21/2255
See application file for complete search history.

(56) References Cited

U.S. PATENT DOCUMENTS

2008/0095678 A1 4/2008 Hasebe et al.

OTHER PUBLICATIONS

Kononchuk et al., "Novel Trends in SOI Technology for CMOS Applications", Solid State Phenomena, vols. 156-158, (2010), pp. 69-76.*

(Continued)

Primary Examiner — Richard Booth
(74) Attorney, Agent, or Firm — TraskBritt

(57) ABSTRACT

A process comprises the following steps: a) provision of a chamber suitable for receiving a plurality of structures, b) circulation of a gas stream in the chamber so that the chamber has a non-oxidizing atmosphere, c) heat treatment of the plurality of structures at a temperature above a threshold value above which the oxygen present in an oxide of a dielectric diffuses through an active layer reacts with semiconductor material of the active layer and produces a volatile material, the process being noteworthy in that the step b) is carried out so that the gas stream has a rate of circulation between the plurality of structures greater than the rate of diffusion of the volatile material into the gas stream.

12 Claims, 4 Drawing Sheets

(51) Int. Cl.
*H01L 21/762* (2006.01)
*H01L 21/673* (2006.01)
*H01L 21/02* (2006.01)
*H01L 21/225* (2006.01)
*H01L 21/687* (2006.01)

(52) U.S. Cl.
CPC .... *H01L 21/2255* (2013.01); *H01L 21/67098* (2013.01); *H01L 21/67309* (2013.01); *H01L 21/68735* (2013.01); *H01L 21/68764* (2013.01); *H01L 21/7624* (2013.01)

(56) References Cited

OTHER PUBLICATIONS

French Preliminary Search Report for French Application No. 1301437 dated Jan. 30, 3014, 2 pages.
International Search Report for International Application No. PCT/FR2014/051406 dated Aug. 18, 2014, 3 pages.
Kononchuk et al, Internal Dissolution of Buried Oxide in SOI Wafers, Sold State Phenomena, vols. 131-133, (2008), pp. 113-118.
Kononchuk et al., Novel Trends in SOI Technology for CMOS Applications, Solid State Phenomena, vols. 156-158, (2010), pp. 69-76.
International Preliminary Report on Patentability for International Application No. PCT/FR2014/051406 dated Dec. 22, 2015, 7 pages.
International Written Opinion for International Application No. PCT/FR2014/051406 dated Aug. 18, 2014, 6 pages.

\* cited by examiner

PROCESS FOR MANUFACTURING A PLURALITY OF STRUCTURES

CROSS-REFERENCE TO RELATED APPLICATIONS

This application is a national phase entry under 35 U.S.C. §371 of International Patent Application PCT/FR2014/051406, filed Jun. 11, 2014, designating the United States of America and published as International Patent Publication WO 2014/202866 A1 on Dec. 24, 2014, which claims the benefit under Article 8 of the Patent Cooperation Treaty and under 35 U.S.C. §119(e) to French Patent Application Serial No. 1301437, filed Jun. 18, 2013, the disclosure of each of which is hereby incorporated herein in its entirety by this reference.

TECHNICAL FIELD

This disclosure relates to a process for manufacturing a plurality of structures, each successively comprising a substrate, a dielectric comprising an oxide, and an active layer comprising a semiconductor material.

BACKGROUND

The expression "active layer" denotes a layer (or a plurality of sublayers) on which or in which components intended for applications, in particular, in the fields of microelectronics, optics and optoelectronics, will be manufactured.

A manufacturing process known from the prior art, illustrated in FIG. 1A, comprises the steps:

a) provision of a chamber 10 suitable for receiving the plurality of structures S, b) circulation of a gas stream F (shown by the arrows) in the chamber 10 so that the chamber 10 has a non-oxidizing atmosphere, c) heat treatment of the plurality of structures S at a temperature above a threshold value above which the oxygen present in the oxide of the dielectric diffuses through the active layer, reacts with the semiconductor material of the active layer, and produces a volatile material.

The chamber provided during step a) is part of a device 1, and is equipped with a support system 4 suitable for supporting the structures S.

The non-oxidizing atmosphere may be obtained during step b) by a continuous gas stream F of an inert gas (such as argon) or a reducing gas. The term "non-oxidizing" is understood to mean an atmosphere that has an oxygen content of less than 10 ppm. The gas stream F is injected into the chamber 10 via an inlet 2 and is discharged from the chamber 10 via an outlet 3.

The heat treatment is carried out during step c) at a high temperature, conventionally of the order of 1200° C.

It should be noted that the steps b) and c) are preferably carried out simultaneously.

Such a prior art process is, in particular, used when the dielectric comprises silicon dioxide, and when the semiconductor material of the active layer comprises silicon. The volatile material produced then comprises silicon monoxide. Step c), therefore, makes it possible to partially dissolve the dielectric. Such a prior art process is particularly advantageous for the manufacture of structures requiring a dielectric thickness of less than 200 nm.

A person skilled in the art will find a technical description of such a process in the articles by Kononchuk (Kononchuk et al., "Novel trends in SOI technology for CMOS applications," Solid State Phenomena, vols. 156-158 (2010), pp. 69-76, and also Kononchuk et al., "Internal Dissolution of Buried Oxide in SOI Wafers," Solid State Phenomena, vols. 131-133 (2008), pp. 113-118).

However, such a prior art process is not completely satisfactory insofar as the applicants have observed that the dissolution of the dielectric during step c) is not uniform, which leads to a non-uniformity of the thickness of the dielectric in the structure manufactured. This non-uniformity is even more detrimental when the desired thickness of the dielectric is small (for example, less than 20 nm or 10 nm) and the diameter of the structure is large (300 mm or 450 mm).

BRIEF SUMMARY

This disclosure aims to overcome the aforementioned drawback and relates to a process for manufacturing a plurality of structures, each successively comprising a substrate, a dielectric comprising an oxide, and an active layer comprising a semiconductor material, the process comprising the steps:

a) provision of a chamber suitable for receiving the plurality of structures, b) circulation of a gas stream in the chamber so that the chamber has a non-oxidizing atmosphere, c) heat treatment of the plurality of structures at a temperature above a threshold value above which the oxygen present in the oxide of the dielectric diffuses through the active layer, reacts with the semiconductor material of the active layer, and produces a volatile material, the process being noteworthy in that the steps b) and c) are carried out so that the gas stream has a rate of circulation between the plurality of structures, denoted by $V_f$, greater than the rate of diffusion of the volatile material into the gas stream, denoted by $V_d$.

The applicant has observed that the non-uniformity of the dissolution of the dielectric during step c) is essentially due to an accumulation of the volatile material in the vicinity of the active layer, which is greater at the center of the structure than at the edges of the structure. This concentration gradient of the volatile material results in an overthickness of the dielectric at the center of the structure. Specifically, the rate of circulation of the gas stream between the plurality of structures is very slow relative to the rate of diffusion of the volatile material into the gas stream; typically $V_f/V_d<10$. The discharging of the volatile material, therefore, takes place predominantly by diffusion (at a rate of the order of mm/s) toward the edges of the structures. The concentration gradient of the volatile material in the vicinity of the active layer thus leads to a slowing down of the dissolution of the dielectric at the center of the structures relative to the edges of the structures.

The disclosure solves this problem with a gas stream that has a rate of circulation between the plurality of structures, denoted by $V_f$, greater than the rate of diffusion of the volatile material into the gas stream, denoted by $V_d$. Thus, the concentration gradient of the volatile material between the structures is prevented by creating a forced circulation of the volatile material, and the dissolution of the dielectric during step c) is rendered uniform, which results in a uniformity of the thickness of the dielectric in the structures manufactured.

It should be noted that the steps b) and c) are preferably carried out simultaneously.

Advantageously, the steps b) and c) are carried out so that $V_f/V_d \geq 100$, preferably $V_f/V_d \geq 1000$.

Thus, such ratios between the rate of circulation of the gas stream in the chamber and the rate of diffusion of the volatile material into the gas stream result in the concentration gradient of the volatile material in the vicinity of the useful layer between each structure being drastically reduced.

According to one embodiment, step b) is carried out so that the gas stream circulates in the vicinity of the active layer of each structure.

Thus, a forced circulation of the volatile material is created between the plurality of structures.

According to one embodiment, the chamber provided during step a) extends along a longitudinal axis, step b) comprises an injection of the gas stream into the chamber, which injection is directed parallel to the longitudinal axis, and step a) comprises a step that consists in equipping the chamber with guide means arranged in order to guide the gas stream injected into the vicinity of the active layer of each structure, the guide means preferably comprising fins positioned around the perimeter of the chamber.

According to one embodiment variant, the chamber provided during step a) extends along a longitudinal axis, step b) comprises an injection of the gas stream into the chamber, which injection is directed parallel to the longitudinal axis, step a) comprises a step that consists in equipping the chamber with support members arranged in order to support the plurality of structures, and the support members are rotatably movable relative to the chamber about the longitudinal axis so that the gas stream circulates in the vicinity of the active layer of each structure.

According to one feature, the support members of a structure form a helix that winds partially around the longitudinal axis, each support member of the structure forming a blade of the helix.

Thus, such support members make it possible to drastically reduce the concentration gradient of the volatile material in the vicinity of the useful layer between each structure by a stirring of the gas stream.

According to one embodiment variant, the chamber provided during step a) extends along a longitudinal axis, and step b) comprises an injection of the gas stream into the chamber, which injection is directed perpendicular to the longitudinal axis and oriented toward each structure so that the gas stream circulates in the vicinity of the active layer of each structure.

Advantageously, the process comprises a step of discharging the gas stream circulating in the vicinity of the active layer of each structure, the discharging of the gas stream out of the chamber being directed perpendicular to the longitudinal axis of the chamber.

Thus, such discharging dedicated to each structure makes it possible to prevent a concentration gradient of the volatile material along the longitudinal axis.

According to another embodiment variant, step b) comprises a step of injection of the gas stream into the chamber, which injection is directed to the center of each structure.

Thus, a forced circulation of the volatile material is created from the center of the structure toward the edges of the structure, this being in order to prevent a concentration gradient of the volatile material in the vicinity of the useful layer between each structure.

Advantageously, step a) comprises a step that consists in equipping the chamber with support members arranged in order to support the plurality of structures, and the support members form ducts arranged in order to guide the gas stream injected to the center of a structure.

Thus, such support members carry out a dual role: the support of the structures and injection of the gas stream.

According to an embodiment, the process comprises a step of discharging the gas stream out of the chamber, and a portion of the gas stream discharged is reinjected into the chamber.

Thus, the concentration of volatile material is homogenized along the chamber in addition to the homogeneity of concentration between the center and the edges of the structures.

Advantageously, the active layer of each structure has a free surface. Step a) comprises a step that consists of equipping the chamber with support means arranged in order to support the plurality of structures, and the process comprises a step of setting the support means in rotational motion about an axis perpendicular to the free surface of the active layer of each structure.

Thus, such setting in motion makes it possible to prevent an asymmetry of the gas stream circulating in the vicinity of the active layer of each structure.

According to one embodiment, the dielectric comprises silicon dioxide, the semiconductor material of the active layer comprises silicon, and the volatile material produced comprises silicon monoxide.

BRIEF DESCRIPTION OF THE DRAWINGS

Other features and advantages will appear in the description that follows of embodiments of a manufacturing process according to the disclosure, given by way of nonlimiting examples, with reference to the accompanying drawings in which.

DETAILED DESCRIPTION

For the various embodiments, the same references will be used for identical components or components that carry out the same role, for the sake of simplification of the description.

Figure 1A:
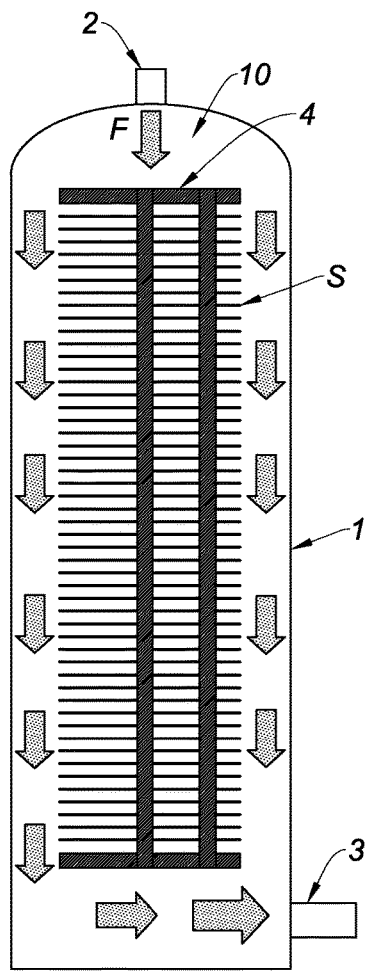
FIG. 1A is a longitudinal cross-sectional view of a device for implementing an embodiment according to the prior art.
Figure 1B:
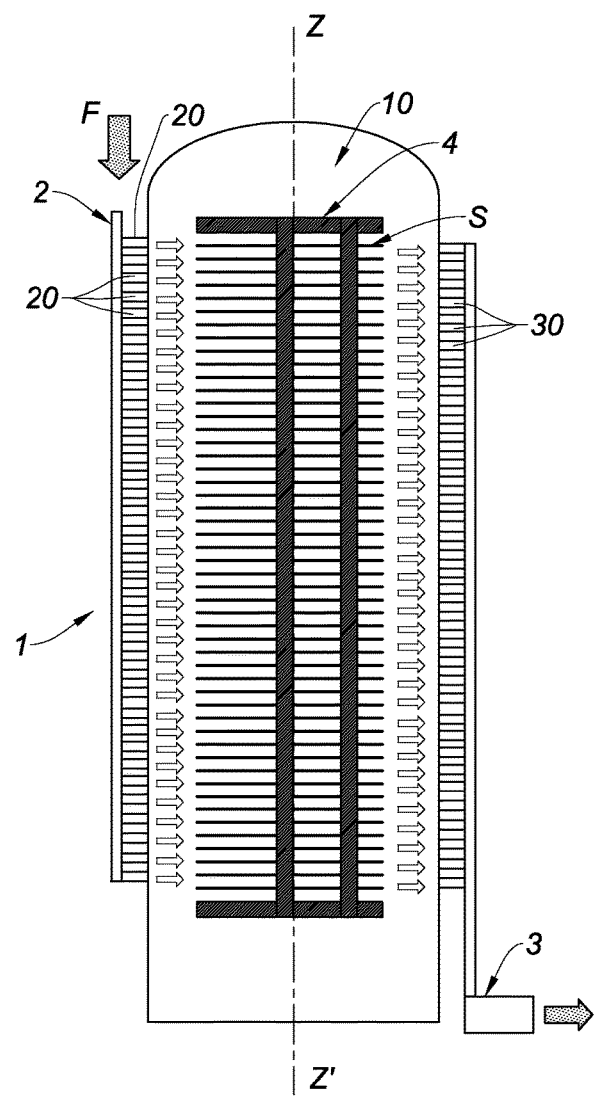
FIG. 1B is a longitudinal cross-sectional view of a device for implementing a first embodiment of the disclosure.

The device 1 illustrated in FIG. 1B is a device for manufacturing a plurality of structures S, each successively comprising a substrate, a dielectric comprising an oxide, and an active layer comprising a semiconductor material.

The device 1 comprises:
a chamber 10 suitable for receiving the plurality of structures S,
means for circulating a gas stream F in the chamber 10 so that the chamber 10 is capable of having a non-oxidizing atmosphere,
heating means capable of giving rise to a heat treatment of the plurality of structures S at a temperature above a threshold value above which the oxygen present in the oxide of the dielectric diffuses through the active layer, reacts with the semiconductor material of the active layer, and produces a volatile material.

The term "non-oxidizing" is understood to mean an atmosphere that has an oxygen content of less than 10 ppm.

The chamber 10 is equipped with a support system 4 suitable for supporting the structures S. The chamber 10 extends along a vertical longitudinal axis Z'-Z.

The circulation means comprises a plurality of injection ducts 20 for injecting the gas stream into the chamber 10. The injection ducts 20 are connected to one another by an inlet 2 of the gas stream F. Each injection duct 20 is dedicated to one structure S. The injection ducts 20 are configured so that the gas stream F has a rate of circulation between the structures S, denoted by $V_f$, greater than the rate of diffusion of the volatile material into the gas stream F, denoted by $V_d$. More specifically, each injection duct 20 may have a diameter smaller than a predetermined value, below which $V_f/V_d \geq 100$, preferably $V_f/V_d \geq 1000$. The diameter of each injection duct 20 may be constant, preferably between 0.5 mm and 1.5 mm, more preferably substantially equal to 1 mm. The injection of the gas stream F into the chamber 10 is directed perpendicular to the longitudinal axis Z'-Z and oriented toward each structure S so that the gas stream F circulates in the vicinity of the active layer of each structure S.

The circulation means comprises a plurality of discharge ducts 30 for discharging the gas stream F out of the chamber 10. The plurality of discharge ducts 30 is arranged opposite the plurality of injection ducts 20. The discharge ducts 30 are connected to one another by an outlet 3 of the gas stream F.

Figure 2:
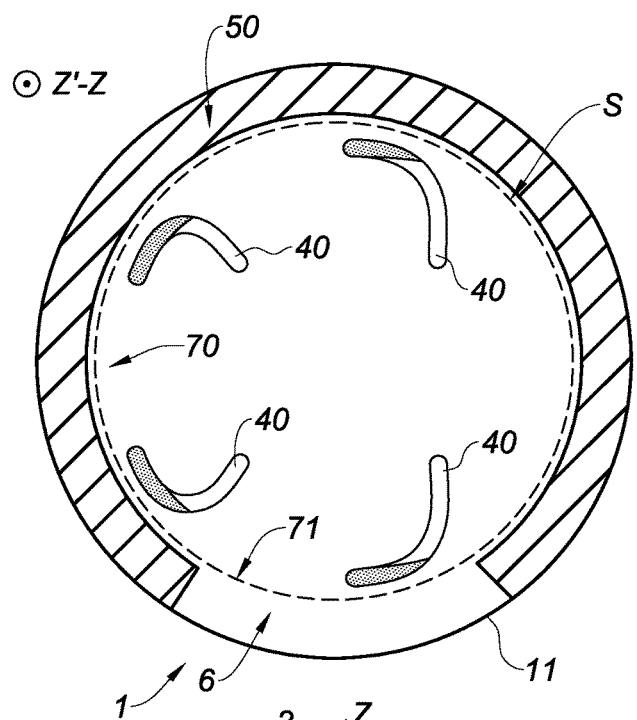
FIG. 2 is a transverse cross-sectional view of a device for implementing a second embodiment of the disclosure.
Figure 3:
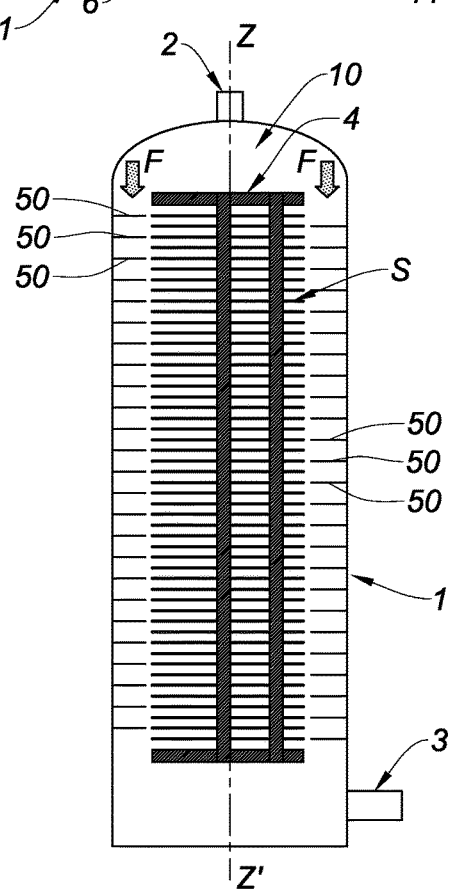
FIG. 3 is a longitudinal cross-sectional view of a device for implementing the second embodiment of the disclosure.

In the embodiment illustrated in FIGS. 2 and 3, the device 1 differs from the device illustrated in FIG. 1B in that:
the injection of the gas stream F into the chamber 10 is directed parallel to the longitudinal axis Z'-Z, and
the chamber 10 is equipped with guide means arranged in order to guide the gas stream F injected into the vicinity of the active layer of each structure S.

The guide means comprises fins 50 positioned around the perimeter of the chamber 10. The fins 50 extend perpendicular to the longitudinal axis Z'-Z and parallel to the structures S. The fins 50 are distributed along the longitudinal axis Z'-Z so that each fin 50 is coplanar to a structure S. When a structure S (in dotted lines in FIG. 2) is supported by the support members 40 belonging to the support system 4, the corresponding fin 50 follows a first portion 70 of the perimeter of the structure S. The corresponding fin 50 delimits an opening 6 with a second portion 71 of the perimeter of the structure S and a housing 11 of the device 1. The circulation of the gas stream F is thus forced through the opening 6. The fins 50 are arranged along the longitudinal axis Z'-Z relative to the structures S so that the gas stream F circulates in the vicinity of the active layer of each structure S.

Figure 4:
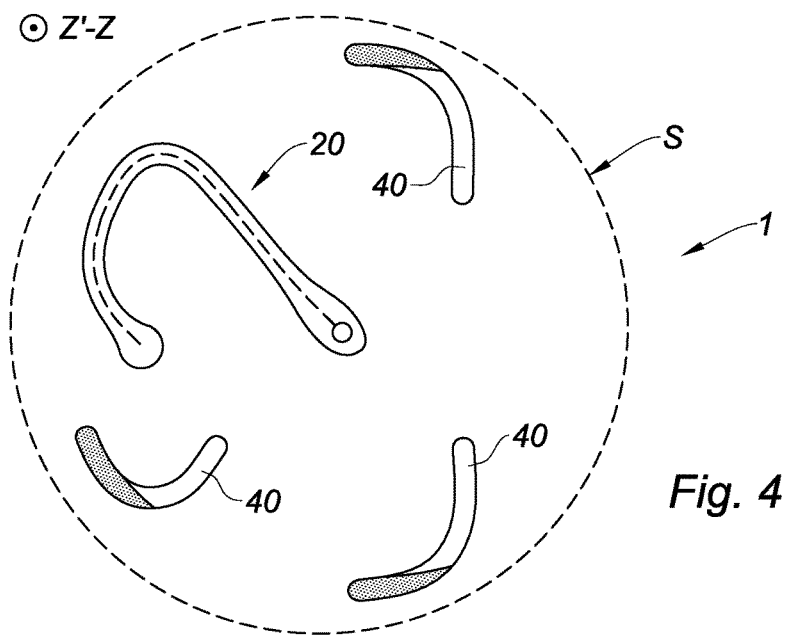
FIG. 4 is a transverse cross-sectional view of a device for implementing a third embodiment of the disclosure.

In the embodiment illustrated in FIG. 4, the device 1 differs from the device 1 illustrated in FIG. 1B and from the device 1 illustrated in FIGS. 2 and 3 in that the circulation means comprises a plurality of injection ducts 20 for injecting the gas stream F into the chamber 10, which are directed to the center of a structure S. Each injection duct 20 forms support means for supporting the structure S located above the structure S at the center of which the corresponding injection duct 20 is directed. The dotted lines from FIG. 4 illustrate the injection of the gas stream F.

Figure 5:
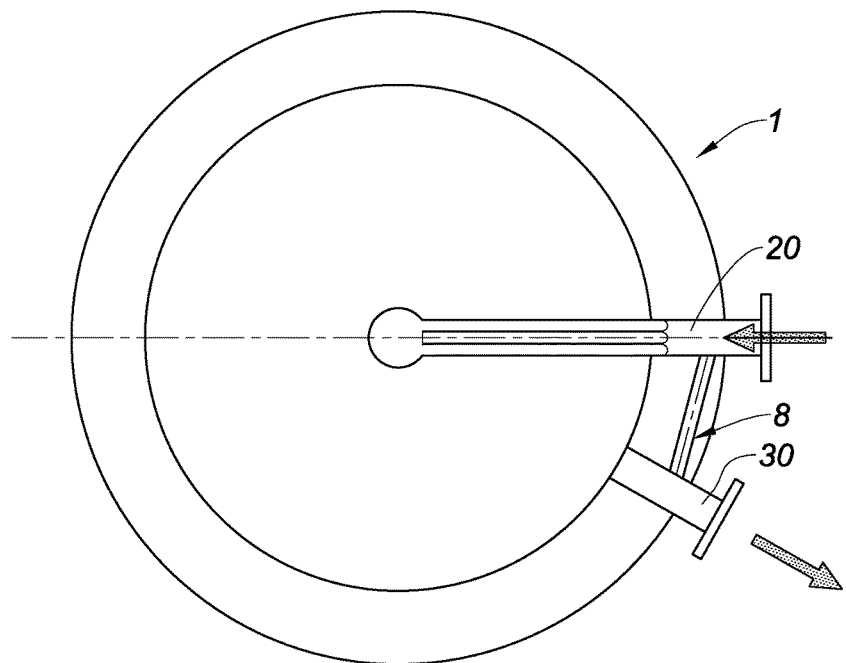
FIG. 5 is a transverse cross-sectional view of a device for implementing a fourth embodiment of the disclosure.

In the embodiment illustrated in FIG. 5, the device 1 comprises a discharge duct 30 for discharging the gas stream F out of the chamber 10. The device 1 comprises a connection channel 8 arranged in order to connect an injection duct 20 to the discharge duct 30. The connection channel 8 has a sufficiently small diameter relative to the diameters of the injection duct 20 and of the discharge duct 30 so as to allow a Venturi effect.

Figure 6:
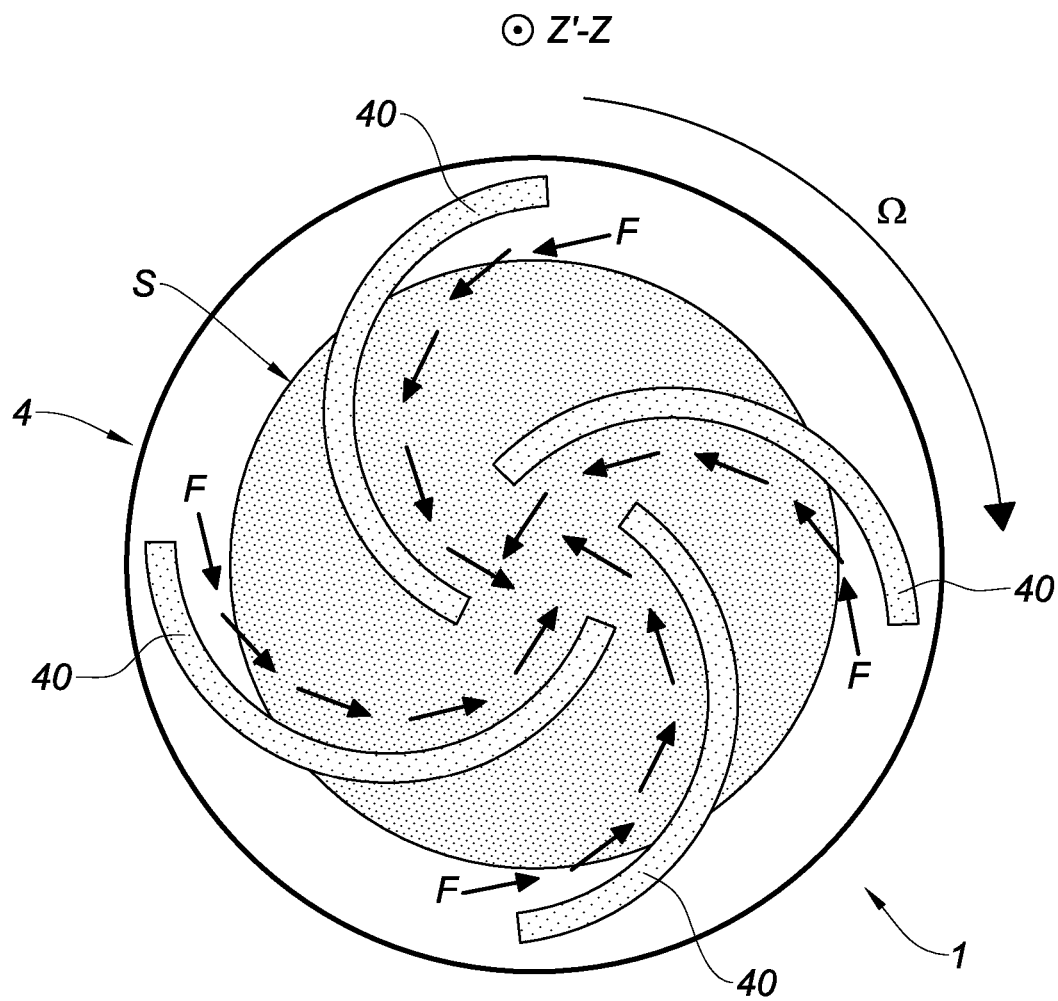
FIG. 6 is a transverse cross-sectional view of a device for implementing a fifth embodiment of the disclosure.

In the embodiment illustrated in FIG. 6, the device 1 differs from the device 1 illustrated in FIGS. 2 and 3 in that the support members 40 are rotatably movable relative to the chamber 10 about the longitudinal axis Z'-Z (with a direction of rotation Ω illustrated in FIG. 6) so that the gas stream F circulates in the vicinity of the active layer of each structure S. The support members 40 of a structure S form a helix that winds partially around the longitudinal axis Z'-Z. Each support member 40 of the corresponding structure S forms a blade of the helix.

According to one embodiment, a process according to the disclosure is a process for manufacturing a plurality of structures S, each successively comprising a substrate, a dielectric comprising an oxide, and an active layer comprising a semiconductor material, the process comprising the steps:
a) provision of a chamber 10 suitable for receiving the plurality of structures S,
b) circulation of a gas stream F in the chamber 10 so that the chamber 10 has a non-oxidizing atmosphere,
c) heat treatment of the plurality of structures S at a temperature above a threshold value above which the oxygen present in the oxide of the dielectric diffuses through the active layer, reacts with the semiconductor material of the active layer, and produces a volatile material.

The steps b) and c) are carried out so that the gas stream F has a rate of circulation between the structures S, denoted by $V_f$, greater than the rate of diffusion of the volatile material into the gas stream F, denoted by $V_d$. The steps b) and c) may be carried out so that $V_f/V_d \geq 100$, preferably $V_f/V_d \geq 1000$. The step b) is carried out so that the gas stream F circulates in the vicinity of the active layer of each structure S. The heat treatment is carried out during step c) at a high temperature, conventionally of the order of 1200° C. Advantageously, the heat treatment is carried out at a temperature above 1150° C. and for a duration of less than 4 hours. It may be, for example, a heat treatment carried out at 1200° C. for less than one hour, or even less than 30 minutes; or else a heat treatment carried out at 1175° C. for less than 3 hours.

According to one embodiment, the chamber 10 provided during step a) extends along a longitudinal axis Z'-Z. Step b) comprises an injection of the gas stream F into the chamber 10, which injection is directed parallel to the longitudinal axis (see FIG. 3). Step a) comprises a step that consists of equipping the chamber 10 with guide means arranged in order to guide the gas stream F injected into the vicinity of the active layer of each structure S. The guide means preferably comprises fins 50 positioned around the perimeter of the chamber 10. As illustrated in FIGS. 2 and 3, the fins 50 extend perpendicular to the longitudinal axis Z'-Z and parallel to the structures S. The fins 50 are distributed along the longitudinal axis Z'-Z so that each fin 50 is coplanar to a structure S. When a structure S (in dotted lines in FIG. 2) is supported by the support members 40 belonging to the support system 4, the corresponding fin 50 follows a first portion 70 of the perimeter of the structure S. The corresponding fin 50 delimits an opening 6 with a second portion 71 of the perimeter of the structure S and the housing 11 of the device 1. The circulation of the gas stream F is thus forced through the opening 6. The fins 50 are arranged along the longitudinal axis Z'-Z relative to the structures S so that the gas stream F circulates in the vicinity of the active layer of each structure S.

According to one embodiment variant illustrated in FIG. 1B, the chamber 10 provided during step a) extends along a longitudinal axis Z'-Z, and step b) comprises an injection of the gas stream F into the chamber 10 via injection ducts 20. The injection ducts 20 are connected to one another by an inlet 2 of the gas stream F. The injection is directed perpendicular to the longitudinal axis Z'-Z and oriented toward each structure S so that the gas stream F circulates in the vicinity of the active layer of each structure S.

As illustrated in FIG. 1B, the process comprises a step of discharging the gas stream F circulating in the vicinity of the active layer of each structure S via discharge ducts 30. The discharging of the gas stream F out of the chamber 10 is directed perpendicular to the longitudinal axis Z'-Z. The plurality of discharge ducts 30 is arranged opposite the plurality of injection ducts 20. The discharge ducts 30 are connected to one another by an outlet 3 of the gas stream F.

According to one embodiment illustrated in FIG. 4, step b) comprises a step of injection of the gas stream F into the chamber 10, which injection is directed to the center of each structure S. Step a) comprises a step that consists of equipping the chamber 10 with support members 40 arranged in order to support the plurality of structures S. At least one support member 40 forms an injection duct 20 arranged in order to guide the gas stream F injected to the center of a structure S.

According to one embodiment illustrated in FIG. 5, the process comprises a step of discharging the gas stream F out of the chamber 10 via a discharge duct 30. A portion of the gas stream F discharged is reinjected into the chamber 10 via an injection duct 20. A connection channel 8 is arranged in order to connect the injection duct 20 to the discharge duct 30. The connection channel 8 has a sufficiently small diameter relative to the diameters of the injection duct 20 and of the discharge duct 30 so as to allow a Venturi effect.

According to one embodiment that is not represented, the active layer of each structure S has a free surface, and the process comprises a step of setting the support system 4 of the plurality of structures S in rotational motion about an axis perpendicular to the free surface of the active layer of each structure S. This embodiment is particularly advantageous in combination with the embodiments illustrated in FIGS. 1B, 2, 3 and 6.

According to one embodiment, the dielectric comprises silicon dioxide, the semiconductor material of the active layer comprises silicon, and the volatile material produced comprises silicon monoxide.

Of course, the embodiments of the disclosure described above do not have any limiting nature. Details and improvements may be made thereto in other embodiment variants without actually departing from the scope of the disclosure.

It is in this way, in particular, that the longitudinal axis Z'-Z may be horizontal.

The invention claimed is:

1. A process for manufacturing a plurality of structures, each successively comprising a substrate, a dielectric comprising an oxide, and an active layer comprising a semiconductor material, the process comprising the following steps:
   (a) provision of a chamber suitable for receiving the plurality of structures, wherein the chamber extends along a longitudinal axis;
   (b) circulation of a gas stream in the chamber so that the chamber has a non-oxidizing atmosphere, comprising an injection of the gas stream into the chamber, the injection being directed parallel to the longitudinal axis; and
   (c) heat treatment of the plurality of structures at a temperature above a threshold value above which the oxygen present in the oxide of the dielectric diffuses through the active layer, reacts with the semiconductor material of the active layer, and produces a volatile material, wherein steps b) and c) are carried out so that the gas stream has a rate ($V_f$) of circulation between the plurality of structures greater than a rate ($V_d$) of diffusion of the volatile material into the gas stream, and wherein steps b) and c) are carried out so that $V_f/V_d \geq 100$;
   wherein step a) comprises a step that includes equipping the chamber with guide means arranged in order to guide the gas stream injected into the vicinity of the active layer of each structure.

2. The process of claim 1, wherein step a) further comprises equipping the chamber with support members arranged in order to support the plurality of structures, and wherein the support members are rotatably movable relative to the chamber about the longitudinal axis so that the gas stream circulates in the vicinity of the active layer of each structure.

3. The process of claim 2, wherein the support members arranged in order to support a structure form a helix that winds partially around the longitudinal axis, each of the support members forming a blade of the helix.

4. The process of claim 1, further comprising discharging the gas stream out of the chamber, and wherein a portion of the gas stream discharged is reinjected into the chamber.

5. The process of claim 1, wherein the active layer of each structure has a free surface, wherein step a) comprises equipping the chamber with support means arranged in order to support the plurality of structures, and wherein the process comprises setting the support means in rotational motion about an axis perpendicular to the free surface of the active layer of each structure.

6. The process of claim 1, wherein the dielectric comprises silicon dioxide, the semiconductor material of the active layer comprises silicon, and the volatile material produced comprises silicon monoxide.

7. The process of claim 1, wherein the heat treatment of the plurality of structures is carried out at a temperature above 1150° C. and for a duration of less than 4 hours.

8. The process of claim 1, wherein steps b) and c) are carried out so that $V_f/V_d \geq 1000$.

9. The process of claim 8, wherein step b) is carried out so that the gas stream circulates in the vicinity of the active layer of each structure.

10. The process of claim 8, further comprising discharging the gas stream out of the chamber, and wherein a portion of the gas stream discharged is reinjected into the chamber.

11. The process of claim 8, wherein the active layer of each structure has a free surface, wherein step a) comprises equipping the chamber with support means arranged in order to support the plurality of structures, and wherein the process comprises setting the support means in rotational motion about an axis perpendicular to the free surface of the active layer of each structure.

12. The process of claim 1, wherein the guide means comprise fins positioned around the perimeter of the chamber.

* * * * *